US012579340B2

(12) United States Patent
　Adra

(10) Patent No.: US 12,579,340 B2
(45) Date of Patent: Mar. 17, 2026

(54) DYNAMIC SIMULATION MODELS CONSTANTLY ADAPTING TO THE CHANGES OF COMPLEX SYSTEMS

(71) Applicant: CreateASoft, Inc., Aurora, IL (US)

(72) Inventor: Hosni I. Adra, Naperville, IL (US)

(73) Assignee: CreateASoft, Inc., Aurora, IL (US)

( * ) Notice: Subject to any disclaimer, the term of this patent is extended or adjusted under 35 U.S.C. 154(b) by 1032 days.

(21) Appl. No.: 17/700,410

(22) Filed: Mar. 21, 2022

(65) Prior Publication Data

US 2022/0215139 A1　　Jul. 7, 2022
US 2023/0029445 A9　　Jan. 26, 2023

Related U.S. Application Data

(63) Continuation of application No. 15/846,091, filed on Dec. 18, 2017, now abandoned.

(60) Provisional application No. 62/435,624, filed on Dec. 16, 2016.

(51) Int. Cl.
G06F 30/20 (2020.01)

(52) U.S. Cl.
CPC ................................... G06F 30/20 (2020.01)

(58) Field of Classification Search
CPC ...................................................... G06F 30/20
See application file for complete search history.

(56) References Cited

U.S. PATENT DOCUMENTS

| | | |
|---|---|---|
| 2008/0177423 A1 | 7/2008 | Brickfield et al. |
| 2009/0119077 A1* | 5/2009 | Norman ................. G05B 17/02 |
| | | 703/6 |
| 2014/0025358 A1 | 1/2014 | Hill et al. |
| 2016/0356125 A1 | 12/2016 | Bello et al. |
| 2018/0144277 A1 | 5/2018 | Srivastava et al. |

OTHER PUBLICATIONS

Hosni Adra, "From Simulation to Real-Time Tracking and Optimization" Proceedings of the 2014 Winter Simulation Conference (Year: 2014).*
Zhang J, Le V, Johnston M, Nahavandi S, Creighton D. Discrete event simulation enabled high level emulation of a distribution centre. In2012 UKSim 14th International Conference on Computer Modelling and Simulation Mar. 28, 2012 (pp. 470-475). IEEE. (Year: 2012).*

* cited by examiner

*Primary Examiner* — Chuen-Meei Gan
(74) *Attorney, Agent, or Firm* — Seed Intellectual Property Law Group LLP

(57) ABSTRACT

The present disclosure relates to systems and methods for updating a plurality of simulation models of a facility. The plurality of simulation models are synchronized and each aspect of each simulation model represents a corresponding aspect of the facility. Data describing a current state of the facility is used to run the simulation model. Additional data describing a changed state of the facility is used to automatically update the simulation model to reflect a change in the state of the facility. Data indicating changes to the facility is used to predict another change to the facility and the predicted change is used to alter at least one of the simulation models.

18 Claims, 2 Drawing Sheets

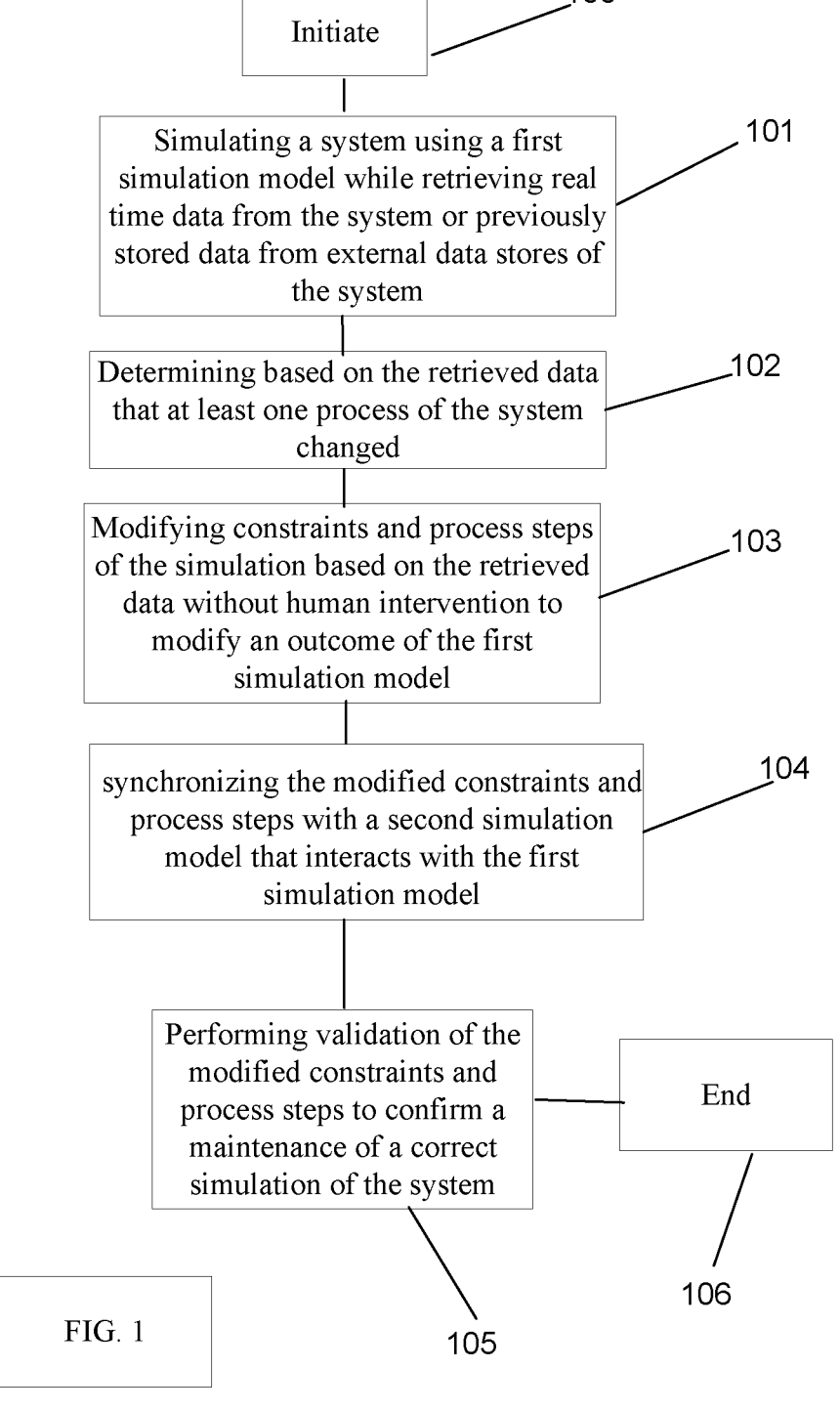

Initiate — 100

Simulating a system using a first simulation model while retrieving real time data from the system or previously stored data from external data stores of the system — 101

Determining based on the retrieved data that at least one process of the system changed — 102

Modifying constraints and process steps of the simulation based on the retrieved data without human intervention to modify an outcome of the first simulation model — 103 synchronizing the modified constraints and process steps with a second simulation model that interacts with the first simulation model — 104

Performing validation of the modified constraints and process steps to confirm a maintenance of a correct simulation of the system — 105

End — 106

FIG. 1

DYNAMIC SIMULATION MODELS CONSTANTLY ADAPTING TO THE CHANGES OF COMPLEX SYSTEMS

CROSS-REFERRENCE TO RELATED APPLICATIONS

This patent application claims priority from U.S. patent application Ser. No. 15/846,091 filed on Dec. 18, 2017, which is incorporated herein by reference.

I. FIELD OF THE INVENTION

The field of the invention relates to dynamic simulation models commonly used to model systems acting in a predicted manner and based on expected data received by the model systems. More specifically, the invention relates to dynamic simulation models generating distributed/multi-threaded simulations with real time data connectivity to model systems, and having the ability to learn from the real time data and modify their constraints, behaviors, and definition in order to stay up to date with their actual environment.

II. BACKGROUND

Unless otherwise indicated herein, the dynamic simulation models described in this section are not prior art to the claims in this application and are not admitted to be prior art by inclusion in this section.

The past few years have experienced tremendous growth in the use of simulation to improve the work place and the efficiency of every operation. Although processor speeds have increased at a very fast pace, simulation, due to its extensive computational requirement and visualization, have consistently challenged and used the processors to their full power. Moreover, with the evolving 64 bit simulation engine technology, simulation models have gotten larger and more complex requiring extensive memory requirements, extended data input set, and increased connectivity. In addition, real-time data is becoming more accessible than ever, and it has contributed greatly to simulation models accuracy, validity and usability.

Therefore, there is a need for dynamic simulation models that include advanced modeling methods that utilize distributed computing models with real-time data connectivity in order to provide predictive analytics, schedule adherence, and dynamic process improvement implementations.

III. SUMMARY

Disclosed herein is a process to generate dynamic simulation models.

Using Dynamic Simulators provide the proper tools and analytics required to analyze and troubleshoot today's complex systems. As new constraints are identified, designers change their dynamic models and use the interactive reporting and visualization in order to define and validate new solutions.

With data connectivity and tracking systems becoming the norm, dynamic simulators are finding their way into the daily routine of designers, managers, operators, and process improvement specialists. Due to their design openness, dynamic simulators can interact with tracking systems (RFID, Barcode, GPS, etc.), and machine PLCs to dynamically create a visual picture of the present, accurately replay past events for analysis, and forecast the future of the operation.

Dynamic simulators, coupled with integrated dashboards and alerts, provide a rich and more complete environment that rivals the analysis and forecasting of current IVIES systems on the market today. Moreover, the ROI of dynamic simulators far exceeds their implementation cost as they provide optimization of the current state while providing an efficient analysis path for all future changes to the operation.

Simulation software can be an effective tool to analyze and optimize process based operations. This abstract details the implementation of a warehouse simulation using the Simcad Pro dynamic simulation environment and its integrated data connectivity. The validated simulation model is then transformed to a real-time system providing live visibility, tracking, and real-time optimization of the warehouse. Details on connecting the model to RFID, Barcode, GPS, and WMS systems are also presented. Real-time visualization and optimization of the facility including; AGV behavior, picking, and replenishment are based on the real-time data received. Moreover, internal and unattended model transformation and optimization based on VMS feedback is explored.

This embodiment as well as other aspects, advantages, and alternatives will become apparent to those of ordinary skill in the art by reading the following detailed description, with reference where appropriate to the accompanying drawings. Further, it should be understood that this summary section and the rest of this document are intended to discuss the provided disclosure by way of example only and not by way of limitation.

IV. INTRODUCTION

In every industry, from manufacturing to services, logistics and healthcare, there is an increasing need to do more with less, increase efficiency while reducing cost, and improve utilization while maximizing throughput. Manufacturing and logistics are at the forefront of this transformation, and changes implemented within their realm are finding their way into other industries.

Process improvement is a constant, never ending effort that strives to achieve better performance with current or reduced resources. As improvement in one area is achieved, other opportunities arise and new ideas are tested and implemented.

Improvement ideas do not always produce the desired results; some improve the performance of a subcomponent while introducing negative consequences to the overall system.

To achieve the required enhancements, process improvement professionals and system designers have introduced automation and smart systems into their current environment. Automation, including AS/RS, Guided Vehicles, smart machinery, and intelligent conveyor systems have been implemented with great promises of exceptionally high OEE (Overall Equipment Effectiveness) and throughput numbers that seemingly make them a one stop solution to all issues.

Although automated systems have such great potential, they also need to perform within two key boundaries. First, they have to interact with human run systems. Humans do not have the robotic behavior of machinery, yet they are indispensable in any environment. Second, automated systems must be able to adapt to fluctuations in the operation, and to the interaction with other automation systems. Moreover, system malfunction, breakdowns and changeover of such systems can have a cascading negative effect on the operation.

This white paper addresses the role of Dynamic Simulation® in enabling designers and process improvement professionals to maximize their design investment, analyze the impact of new equipment, and be better prepared for future changes to their operation.

V. CHALLENGES

Why do current designs fail to achieve their promised performance?

Recurring questions often come up in meetings, offline discussions, and in the minds of all designers; how many guided vehicles do we need? Is our slotting optimized? How much buffering do we need to support a manual operation? How can we better schedule our tanks? What is the impact of the cleaning cycle? The list goes on. The fact is that there are many questions that need to be answered. Some are more pressing than others, while most can have a negative impact on the performance of the system if not handled properly.

In the case of simple systems, where a single input, a single output and a constant feed rate produce a single product, computing the system throughput and OEE is simple. Unfortunately, a closed loop system with a single product type is seldom the case. Automated systems are built to handle multiple product types and variations in order to meet their ROI. To complicate things further, different products require different speed rates, change-over and sometimes labor requirements. All of these constraints contribute to the overall system throughput and OEE, making a simple formula computation an invalid and inaccurate representation.

A common negative effect of improper system throughput calculation is that operations are promising customer deliveries based on high OEE of individual components. Although each independent subcomponent performs at the designed specifications, the overall system OEE is lower due to component interactions, product variations and other unexpected delays. Equipment ROI is not achieved, order delays become a common occurrence, and frustration sets in.

One example of improper identification of system inefficiencies is more apparent when identifying the optimum number of guided vehicles needed for an operation; a Sorting Transfer Vehicle (STV) loop that interacts with three systems, one unloading station driven by a human interface and two loading automated operations.

Historically, a quick math formula that takes into consideration the inbound rate, speed of loading/unloading, and STV speed is used to identify the number required. Then designers add an additional STV as "extra buffer", or cushion, for the system. When the system goes online and external factors start to impact the STV loop its efficiency drops and all connected systems follow suit. In certain situations, the STV track is interacting with processes that have a manual component. With a limited number of available drop locations or inadequate buffer capacity at the manual stations, any inefficiency in the manual operation will have a cascading effect on the STV loop itself as loaded STVs need to complete additional loops on the track while waiting for a drop location to become available. When the majority of the STVs are loaded with products, it is assumed that the loop has reached its maximum throughput, and additional STVs are needed. The fact is that even though products are loaded on the STVs, the loop efficiency is low since multiple passes are needed before a drop can be made.

As a result the STV loop is viewed as the choke point of the system, while, in reality, the STV loop efficiency is low due to inefficiencies in the interfacing systems. The solution is not achieved by adding STVs to the loop, but by finding the external conditions that are causing the reduced efficiency. The true system efficiency in this case is not measured based on how many guided vehicles have products, but by how many successful single pass moves are achieved.

The list of examples is endless, and systems, although designed with the best intention in mind, fail to meet the set expectations when implemented as part of a larger system. Two key problems are apparent. The first is related to systems interaction where the initial system design does not take into consideration the impact of other systems (both human and automated). The second is driven by the fact that all systems are evolving, and initial logic and interaction criteria will constantly change.

BRIEF DESCRIPTION OF THE FIGURES

In the figures:

FIG. 1 is a flow chart illustrating a method, according to one embodiment of the present invention, of activities of dynamic simulation models.

DETAILED DESCRIPTION OF THE FIGURES

Figure 2:
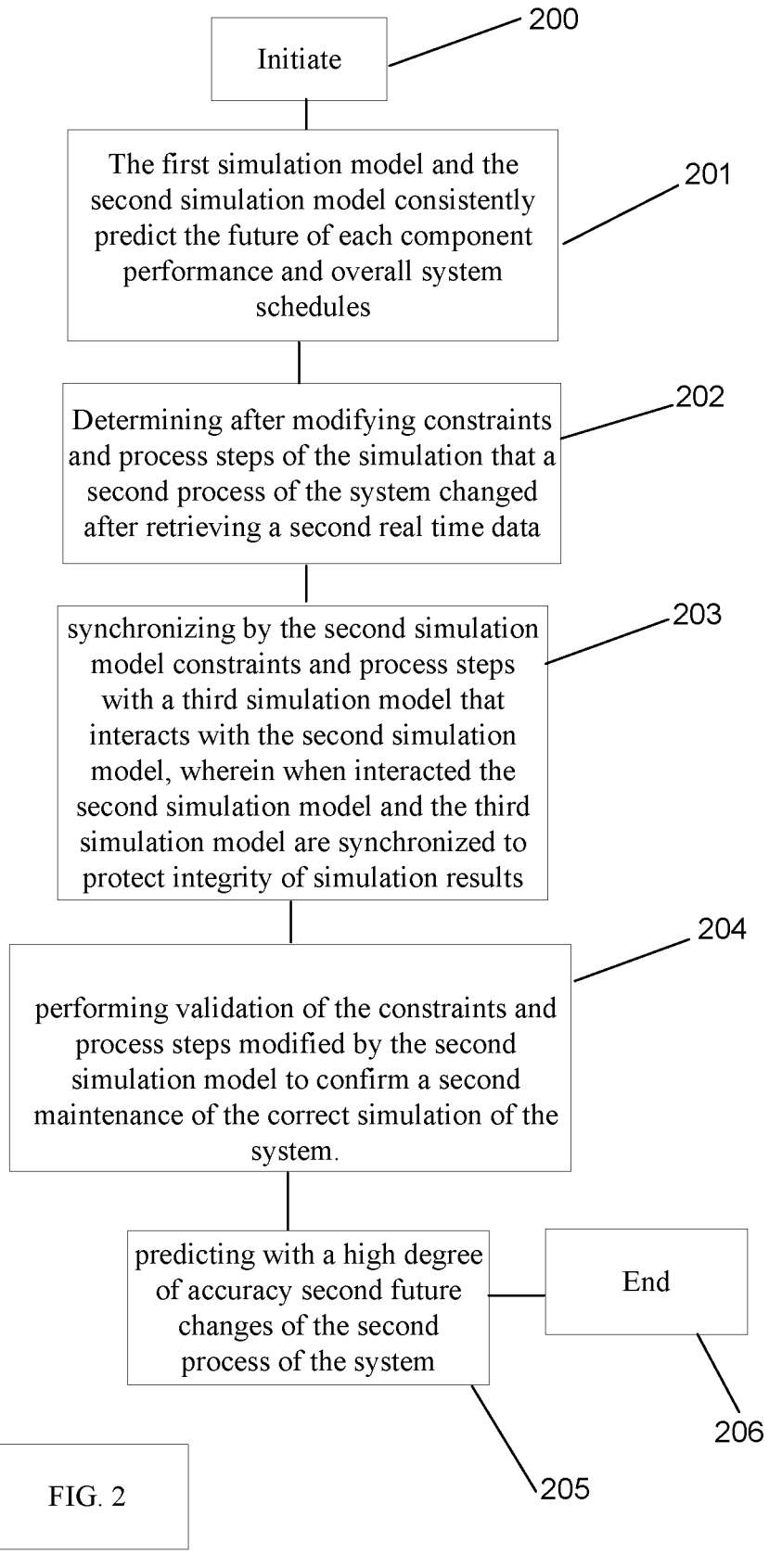
FIG. 2 is a flow chart illustrating additional features of the method shown in FIG. 1.

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

As shown in FIG. 1, a method for maintaining a correct simulation of a system using simulation models, comprises simulating the system using a first simulation model while retrieving real time data from the system and previously stored data from external stores of the system, determining by the first simulation model that at least one process of the system changed based on the retrieved real time data and previously stored data, modifying by the first simulation model constraints and process steps of the simulation based on the retrieved real time data without human intervention to modify an outcome of simulation.

In addition to the first simulation model, the model comprises synchronizing by the first simulation model constraints and process steps with a second simulation model that interacts with the first simulation model, wherein when interacted the first simulation model and the second simulation model are synchronized to protect integrity of simulation results, performing validation of the modified constraints and process steps to confirm a maintenance of the correct simulation of the system, and predicting with a high degree of accuracy future changes of the at least one process of the system As shown in FIG. 2, the first simulation model and the second simulation model consistently predict the future of each component performance and overall system schedules. The method then proceeds to determining after modifying constraints and process steps of the simulation that a second process of the system changed after retrieving a second real time data, and synchronizing by the second simulation model constraints and process steps with a third simulation model that interact with the second simulation model. Moreover, when interacted the second simulation model and the third simulation model are synchronized to protect integrity of simulation results.

In addition, the method further proceeds to performing validation of the constraints and process steps modified by the second simulation model to confirm a second maintenance of the correct simulation of the system, and predicting with a high degree of accuracy second future changes of the second process of the system.

Building a Dynamic Simulation Model

Model Building

A dynamic simulator's model building environment provides instructions that allow users to define the model without relying on code, and without generating code in the background. In an automated warehousing environment, start by defining a single ASRS storage unit, the AGV/STV interaction loop, conveying system and other manual racks. For ease of model building, a single entity of each component is built and validated before the full model is expanded.

Location and initial state information is retrieved per product SKU and the ARS storage unit is expanded to support the proper behavior. The next step is to define the AGV interaction logic. Keep in mind that the model data will need to vary after the model connects to live data systems, therefore the model needs to define the entity behavior and logic.

Expand the conveying behavior for the remaining entities and inbound/outbound interfaces to the STV/AGV loop. This section will be driven by the WMS data feed at a later model stage.

In between each step, validate the model using data retrieved from existing systems. A data example may be a daily storage and retrieval schedule from the ASRS to and from inbound/outbound areas. For the model to be valid, its output must match the actual system output.

A common mistake is to force the model to generate the required throughput using injected wait times that are unique to the data set being used. This type of implementation must be avoided at all cost as it impacts the model validation and every decision made going forward.

Model Validation and Interaction

With the base model built, perform a complete validation on the defined system components. This is an important step to make sure that all the components are implemented correctly, and that no constraint is added that is not part of the actual system behavior.

With the components validated, the ASRS is now expanded to support all locations needed, along with travel distances to each location. In a dynamic simulator, the distances should be automatically computed and ASRS speed is the only input into the model. Expand the remaining entities by duplicating already validated behavior.

Run a full validation of the model and start interacting with the simulated environment in order to validate the final behavior and verify that all constraints have been implemented.

An example interaction scenario is to play the what-if game live, while the rest of the system reacts and the simulation is running. Using the STV example, dynamically break down AGVs/STVs, create a delay on the ASRS, or pause unloading processes of the system. Since the above interactions are performed live, during the simulation run, the model reaction can be visualized through its animation and reaction compared to the actual system behavior.

At this point, the model may be used to analyze new scenarios, identify improvement areas, and perform capacity analysis.

Connectivity

As with the interactive environment, Dynamic simulators have an integrated ability to connect to data systems at run time, and do not preload the data into their environment. Use the integrated features to directly pull data from the external systems (WMS, RFID, PLCs, Barcode scans). The dynamic interaction that was performed on the simulation manually is now performed directly through the integrated data connectivity making the model a live replica of the warehouse. By making the model aware of the current state of the warehouse, and its historical performance, it can, within a high degree of accuracy, consistently predict the future of each component performance and overall system schedules.

Two key advantages are apparent;

There is no limit to the amount of data or data sources available to the simulator. In other words, since the system connect to existing ERP, MRP, WCS, and WMS systems, pull in the current state, previous behavior, and future orders it can perform a simulation analysis without requiring any model changes.

The developed model can also be used for daily scheduling and analysis activities. Since the model is already developed and connected to actual systems, a daily run can provide insight on the day outlook and allow managers to be better prepared to handle any potential problems that may arise.

Analysis and Visualization

By utilizing the built features of a Dynamic simulator, all required analysis values for the model are generated. Lead times, utilization, efficiency, throughput rates and cycle times are all integral parts of the model and can be displayed or analyzed as part of the model view.

From a visualization perspective, the animated environment of a dynamic simulator is more effective since it represents the current state of the simulation engine. What is animated on the screen is what the simulation engine is doing, including how current constraints are impacting the system behavior and analytics.

Dynamic Value Stream and Other Views

Data generated by the live model can be displayed in different formats from overall performance metrics to section specific information. In addition, the system can display current deviation from standards, a dynamic value stream based on current numbers and other metrics required to effectively manage the operation.

Expandability

As all systems evolve and change through time, the model needs to be constantly adapted to the changes in the actual environment. By using the capabilities of dynamic simulators, the model can evolve dynamically as live systems evolve. When new locations are added, a new machine defined, or an extra AGV inserted in the system, the model dynamically changes behavior and applies the necessary changes on the model with minimal human interaction.

Large simulation models that span full warehouses, manufacturing plants hospitals and other type of environment are complex, compute intensive, and require more time to run using traditional single threading simulation environments. Take for example a warehousing implementation that involves multiple ASRS systems, standard racking, AGVs for material handling, automation equipment, high speed lines, and most of all human workers consistently interacting with all aspects of the warehouse. To drive such system, data must be available from the WMS (Warehouse management system), WSC, PLCs, RFID and other data points tracked through either SAP or barcode and manual entry. For offline runs, waiting for the model to complete the run is not as critical or demanding. On the other hand, when the model is converted to real time predictive tool, model run turnaround, and multiple scenario and Monte Carlo runs become critical. Whether the implementation is for schedule adherence, predictive bottleneck detection, or other efficiency and improvement alerts, 2 key factors play in the overall solution, simulation speed, and model validity and accuracy.

Simulation speeds can be achieved by better utilizing the underlying hardware system. Whether smaller independent and interacting models are used, or highly distributed single model implementation some key challenges arise in model synchronization and real-time data availability. As discussed later, there are many methods that can be implemented to successfully distribute the model and achieve extensive improvement in simulation run speed without disturbing model validity.

Model accuracy on the other hand can be even more challenging, especially when real time data is used. In the case of static environments, the modeler is aware of the different process steps and movements that parts or resources are taking. Model constraints can be imposed using the known data environment and current requirement. In the case of real time data and real-time predictive environments, models need to be designed in a way that allows them to grow with the system, enable real-time constraint changes, and in some case, expand themselves in order to maintain the correct relationship with live data. In other words, models need to run with an intelligent environment that allows them to modify their constraints or process steps based on data feedback from external data sources and without human intervention. This is a key technology that enables systems to be used as turnkey, hands off, systems that are constantly evolving within their environment while maintaining a high degree of validity and result accuracy.

The presented technology, although evolving, has successfully been used and overcome many challenges. When simulation models interact, they need to be intelligently synchronized in order to protect the integrity of the simulation results and validity of the models. Whether the implementation spans a single system using multithreading methods, or multiple systems using inter processors synchronization, the synchronization is one key item that must be controlled.

In addition to the synchronization challenge, simulation that interact with external, real-time data systems must have a defined set of rules that are required to maintain the integrity of the integration with outside systems. In other words, real-time data need to be clearly mapped to the model in a way that prevents ambiguity while provide an efficient redundancy level. Whether the data is being retrieved from external data stores (Databases, SAP, WMS, ERP, EMR) or received asynchronously through PLCS or RFID data set, it needs to be handled in time and provided to the model for further processing. Simulation environment can then use the data in real-time and modify the outcome of the model while the simulation is running, or save the constraints and change for the next model run.

The most challenging aspect of the intelligent models is their ability to constantly evolve based on the real-time environment without disturbing the validity of the models. Such models are developed in a way to react to incoming data and add or remove constraints based on the actual environment. Intelligent models consistently learn from the current environment, readjust on-the-fly and consistently perform validation and change rollout in order to provide a hands free environment.

In addition, we are adding real-time optimization that provides the user with multiple option to get back on track or resolve the issue. The results can be pushed back to either an execution management system or to PLCs and equipment hardware.

What is claimed is:

1. A system for automatically updating a simulation model representing a warehouse, the system not constituting transitory propagating data signals, the system comprising:
   a computing device configured to run the simulation model;
   the computing device being further configured to:
      receive data describing a current state of the warehouse;
      run the simulation model based on the data describing the current state of the warehouse, the simulation model including a plurality of aspects, each aspect of the simulation model representing a corresponding aspect of the warehouse;
      receive additional data describing an updated state of the warehouse;
      identify at least one aspect of the warehouse which has changed based on the received additional data;
      in response to the identifying, alter the simulation model to reflect the changed at least one aspect of the warehouse while the simulation model continues running;
      add data indicating that the at least one aspect of the warehouse has changed to a list of changes of aspects of the warehouse;
      while the simulation model is running:
         run a second simulation model synchronously with the simulation model, the second simulation model representing the warehouse based on the additional data describing the updated state of the warehouse; and
         synchronizing the second simulation model with the simulation model by altering the second simulation model based on the identified changed at least one aspect of the warehouse;
      validating the alteration of the simulation model based on at least the additional data describing the updated state and the changed at least one aspect by:
         determining whether the changed at least one aspect introduces an error into the simulation model; and
         determining whether the simulation model is in a valid state after being altered based on the determination of whether the changed at least one aspect introduces the error into the simulation model;
      generate predicted data describing a predicted state of the warehouse based on the list of changes of aspects of the warehouse;
      identify at least one aspect of the warehouse which was predicted to change based on the predicted data; and based on the identifying, alter the second simulation model to reflect the predicted change to at least one aspect of the warehouse while the second simulation model continues running.

2. The system of claim 1, wherein the data indicating the current state of the warehouse and the additional data indicating the updated state of the warehouse are received from a continuous stream of data which is accessible by the simulation model.

3. The system of claim 1, wherein the identified change is an addition of a new aspect of the warehouse, the method further comprising:

identifying an aspect of the simulation model based on the new aspect of the warehouse; and altering the simulation model to reflect the changed at least one aspect while the simulation model continues running, by:

adding a new aspect of the simulation model which represents the new aspect of the warehouse; and configuring the new aspect of the simulation model based on a configuration of the identified aspect of the simulation model.

4. The system of claim 1, wherein the at least one aspect of the warehouse that has changed comprises a resource representing one or more of: a machine or a worker.

5. One or more instances of computer-readable media not constituting a transitory propagating data signal collectively having contents configured to cause a computing device to perform a method for automatically updating a simulation model representing a facility, the method comprising:

receiving data describing a current state of the facility;

synchronously running a plurality of simulation models including the simulation model based on the data describing the current state of the facility, each of the simulation models including a plurality of aspects, each aspect of the simulation models representing a corresponding aspect of the facility;

receiving additional data describing an updated state of the facility;

identifying at least one aspect of the facility has changed based on the received additional data;

in response to the identifying, synchronizing the simulation model and at least one other simulation model of the plurality of simulation models by altering the simulation model and at least one other simulation model of the plurality of simulation models to reflect the changed at least one aspect of the facility while the simulation model continues running and while the at least one other simulation model continues running;

validating the alteration of the simulation model based on at least the additional data describing the updated state and the changed at least one aspect by:

determining whether the changed at least one aspect introduces an error into the simulation model; and determining whether the simulation model is in a valid state after being altered based on the determination of whether the changed at least one aspect introduces the error into the simulation model;

predicting a new change to an aspect of the facility based on the identified at least one aspect of the facility that has changed; and altering at least one simulation model of the plurality of simulation models based on the predicted change.

6. The one or more instances of computer-readable media of claim 5, wherein the identified change is an addition of a new aspect of the facility, the method further comprising:

identifying an aspect of the simulation model based on the new aspect of the facility; and altering the simulation model to reflect the changed at least one aspect while the simulation model continues running, by:

adding a new aspect of the simulation model which represents the new aspect of the facility; and configuring the new aspect of the simulation model based on a configuration of the identified aspect of the simulation model.

7. The one or more instances of computer-readable media of claim 5, wherein the at least one aspect of the facility that has changed comprises a resource representing one or more of: a machine or a worker.

8. The one or more instances of computer-readable media of claim 5, wherein the at least one aspect of the facility that has changed comprises one or more of: an item or an object.

9. The one or more instances of computer-readable media of claim 5, wherein the at least one aspect of the facility that has changed comprises an item type.

10. The one or more instances of computer-readable media of claim 5, wherein the at least one aspect of the facility that has changed comprises one or more of: a location of a workstation or a location of a storage area.

11. The one or more instances of computer-readable media of claim 5, wherein the data indicating the current state of the facility and the additional data indicating the updated state of the facility are received from a continuous stream of data which is accessible by the simulation model.

12. A method for automatically updating a plurality of synchronized simulation models each representing a portion of a facility, the method comprising:

receiving data describing a current state of the facility;

synchronously running the plurality of synchronized simulation models based on the data describing the current state of the facility, each simulation model of the plurality of synchronized simulation models including a plurality of aspects, each aspect of each simulation model representing a corresponding aspect of the facility;

receiving additional data describing an updated state of the facility;

identifying, by at least one simulation model of the plurality of synchronized simulation models, at least one aspect of the facility has changed based on the received additional data;

in response to the identifying, synchronizing the plurality of synchronized simulation models by:

indicating to each simulation model of the plurality of synchronized simulation models, that the at least one aspect of the facility has changed; and altering each simulation model of the plurality of synchronized simulation models to reflect the changed at least one aspect of the facility while each respective simulation model continues running;

validating the alteration of each respective simulation model of the plurality of simulation models based on at least the additional data describing the updated state and the changed at least one aspect by:

determining whether the changed at least one aspect introduces an error into the respective simulation model; and determining whether the respective simulation model is in a valid state after being altered based on the determination of whether the changed at least one aspect introduces the error into the respective simulation model;

predicting a new change to an aspect of the facility based on the identified at least one aspect of the facility that has changed; and altering at least one simulation model of the plurality of synchronized simulation models based on the predicted new change.

13. The method of claim 12, wherein the identified change is an addition of a new aspect of the facility, the method further comprising:

altering each respective simulation model to reflect the changed at least one aspect while the respective simulation model continues running, by:

identifying an aspect of the respective simulation model based on the new aspect of the facility; and adding a new aspect of the respective simulation model which represents the new aspect of the facility; and configuring the new aspect of the respective simulation model based on a configuration of the identified aspect of the at least one simulation model.

14. The method of claim 12, wherein the at least one aspect of the facility that has changed comprises a resource representing one or more of: a machine or a worker.

15. The method of claim 12, wherein the at least one aspect of the facility that has changed comprises one or more of: an item or an object.

16. The method of claim 12, wherein the at least one aspect of the facility that has changed comprises an item type.

17. The method of claim 12, wherein the at least one aspect of the facility that has changed comprises one or more of: a location of a workstation or a location of a storage area.

18. The method of claim 12, wherein the data indicating the current state of the facility and the additional data indicating the updated state of the facility are received from a continuous stream of data which is accessible by each simulation model of the plurality of synchronized simulation models.

* * * * *